LINEARIZED FIELD-EFFECT TRANSISTOR CIRCUIT

Filed May 20, 1963 2 Sheets-Sheet 1

INVENTOR.
GORDON F. ROGERS
BY Eugene M. Whitacre
Attorney

Oct. 19, 1965 G. F. ROGERS 3,213,299

LINEARIZED FIELD-EFFECT TRANSISTOR CIRCUIT

Filed May 20, 1963

2 Sheets-Sheet 2

INVENTOR.
GORDON F. ROGERS
BY
Eugene M. Whitacre
Attorney

United States Patent Office 3,213,299
Patented Oct. 19, 1965

3,213,299
LINEARIZED FIELD-EFFECT TRANSISTOR CIRCUIT

Gordon F. Rogers, Moorestown, N.J., assignor to Radio Corporation of America, a corporation of Delaware
Filed May 20, 1963, Ser. No. 281,505
20 Claims. (Cl. 307—88.5)

This invention relates in general to electrical circuits embodying bidirectional semiconductor devices, and more particularly to electrical circuits embodying bidirectional semiconductor devices which are utilized as voltage controlled variable resistances.

Some known types of semiconductor devices have particularly useful applications as variable resistance devices due to their bidirectional characteristics. A voltage-controlled variable resistance device is useful in combination with signal translating circuits such as amplifiers, phase detector circuits, and other signal translating circuits, in which it is desired to control the amplitude of the signal to be translated.

Among the bidirectional semiconductor devices which have been successfully used as voltage-controlled variable resistance devices, for example, are the so-called field-effect transistors. When field-effect transistors, and other semiconductor devices, such as bidirectional transistors for example, are employed as variable resistance devices it is desirable that the resistance exhibited by the semiconductor device be symmetrical for input signals of both polarities. Asymmetry in operation is due to the fact that the device operates in a common source mode for one polarity of signal excursion and in a common drain mode for the opposite polarity of signal excursion. During the period when the device is operating in the common drain mode, the signal voltage adds to the control voltage in establishing the device operating point, whereas this is not true when the device operates in the common source mode.

Accordingly, it is an object of this invention to provide an improved voltage-controlled variable resistance network employing a semiconductor device.

It is another object of this invention to provide an improved voltage-controlled variable resistance network, which employs a field-effect transistor and exhibits symmetrical resistance to input signals of opposite polarity.

The variable resistance circuit embodying the invention includes a field-effect semiconductor device having first and second electrodes defining a current path and a control electrode that determines the resistance exhibited by the current path. The variable resistance circuit may be used to control the efficiency of signal transfer between a signal input circuit and a signal output circuit as a function of the resistance exhibited by the current path of the semiconductor device. A portion of the voltage developed across the current path of the semiconductor device, such as one half the voltage, is applied to the control electrode through a capacitor with the purpose of causing the semiconductor device to exhibit a symmetrical resistance to input signals of either polarity. The resistance of the current path is controlled by a control voltage applied between the gate electrode and a point of reference potential. The capacitive coupling of the signal to the control electrode permits the control voltage which controls the resistance of the current path to be connected between the control electrode and reference potential such as ground rather than between the control electrode and the signal feedback point (floating above ground) as would be required without the capacitor.

Another variable resistance circuit embodying the invention may include an insulated-gate field-effect transistor having first and second electrodes formed on a substrate of semiconductor material and a gate electrode insulated from the substrate. The gate electrode and the substrate of semiconductor material control the resistance exhibited by the current path as a function of the control voltages respectively applied to the gate electrode and the substrate. The variable resistance circuit is connected between a signal input circuit and a signal output circuit to control the efficiency of signal transfer between the circuits as a function of the resistance exhibited by the current path. A portion of the signal voltage developed across the current path is coupled to one of the gate electrode and substrate of semiconductor material to provide symmetry to the resistance exhibited by the current path. A control voltage is applied to the other of the gate electrode and substrate of semiconductor material for controlling the resistance exhibited by the current path.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
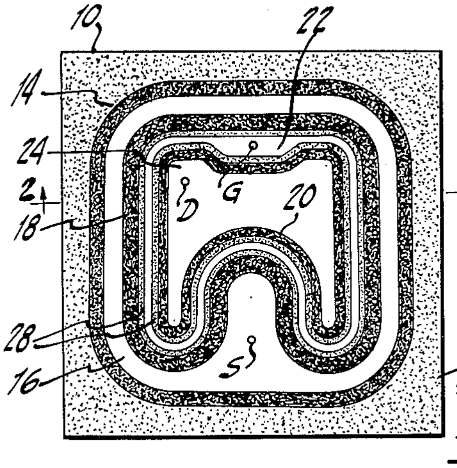
FIGURE 1 is a diagrammatic view of an insulated-gate field-effect transistor suitable for use in circuits embodying the invention.

Referring now to the drawings and particularly to FIGURE 1, a field-effect transistor 10 which may be used with circuits embodying the invention includes a substrate or a body 12 of semiconductor material. The body 12 may be either a single crystal or polycrystalline, and may be of any of the semiconductor materials used to prepare transistors in the semiconductor art. For example, the body 12 may be nearly intrinsic silicon, such as, for example, lightly doped P-type silicon of 100 ohm-cm. material.

In the manufacture of the device shown in FIGURE 1 heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
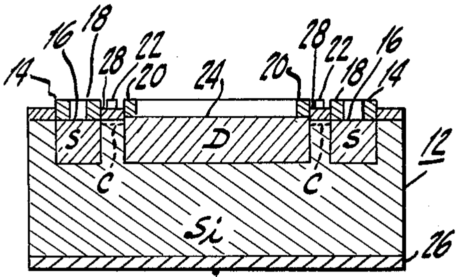
FIGURE 2 is a cross sectional view taken along section line 2—2 of FIGURE 1.

The body 12 is then heated in a suitable atmosphere, such as water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross section view taken along section 2—2 of FIGURE 1, shows the source-drain regions labeled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first darker zone 14 is grown silicon dioxide. The white area 16 is the metal electrode corresponding to the source electrode. Dark or more heavily stippled zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The input resistance of the device at low frequencies is of the order of $10^{14}$ ohms. The layer of grown silicon dioxide 28 on which the gate electrode 22 is mounted, overlies an inversion layer or conductive channel C connecting the source and drain regions. The gate electrode 22 is placed symmetrically between the source region S and the drain region D. If desired, however, the gate electrode 22 may be displaced towards the source region and may overlap the deposited silicon dioxide layer 18.

Reference is now made to FIGURE 2 of the drawings. The boundaries separating the source and drain regions S and D and the body of silicon substrate 12 effectively operate as a pair of rectifying junctions coupling the silicon substrate 12 to the source and drain electrodes 16 and 24, in such a manner that a positive bias voltage applied to the substrate with respect to the drain and source electrodes 16 and 24 renders the rectifying junction conductive, i.e., forward biased.

Figure 3:
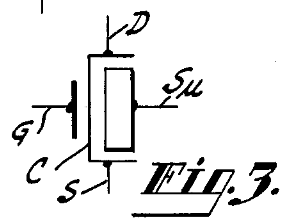
FIGURE 3 is a symbolic representation of an insulated-gate field-effect transistor.

FIGURE 3 is a symbolic representation of the insulated gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and source electrodes as a function of the polarity of the bias potential applied therebetween; i.e., the electrode to which a positive bias potential is applied (relative to the bias potential applied the other electrode) operates as a drain electrode, and the other electrode operates as a source electrode.

The drain and source electrodes are connected to each other by a conductive channel C. The majority current carriers (in this case electrons) flow from source to drain in this thin channel region close to the surface. The conductive channel C is shown in FIGURE 2 in dotted lines.

If the body 12 is lightly doped N-type silicon, rather than P-type as described in connection with FIGURES 1 and 2, then the drain and source regions D and S are doped with P-type impurities. The majority current carriers are in this case holes, and the one electrode biased more negatively with respect to the other electrode operates as the drain electrode and the other electrode operates as the source electrode.

The rectifying junctions, coupling the substrate to the source and drain electrodes in N-type substrate transistors are poled so that a voltage applied to the substrate that is more negative than the voltage at the source and drain electrodes respectively, renders the rectifying junctions conductive.

Figures 4, 6, 6A, 6B:
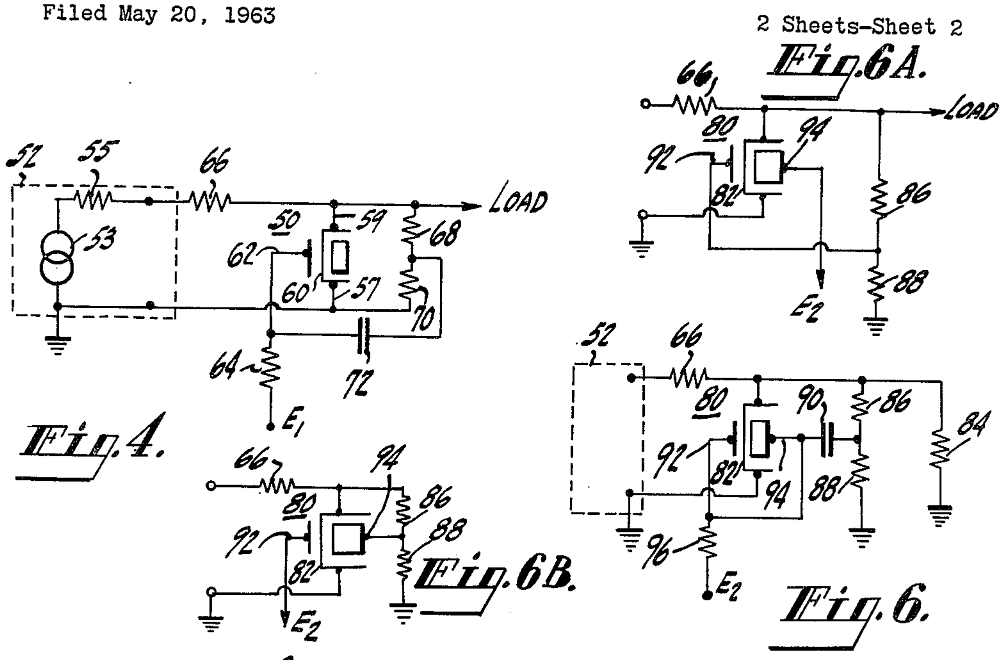
FIGURE 4 is a schematic circuit diagram of a voltage controlled variable resistance circuit embodying the invention.
FIGURE 6 is a schematic circuit diagram of another voltage controlled variable resistance circuit embodying the invention.
FIGURE 6A is a schematic circuit diagram of a modified version of the circuit shown in FIGURE 6.
FIGURE 6B is a schematic circuit diagram of another version of the circuit shown in FIGURE 6.

Reference is now made to FIGURE 4 which is a schematic circuit diagram of a voltage controlled variable resistance circuit embodying the invention. There is shown an insulated-gate field-effect transistor 50 coupled between a signal source 52, which comprises a signal generator 53 having an internal generator impedance 55, and a load (not shown) which may be the input impedance of the utilization circuit, such as an amplifier circuit, for example. The transistor 50 has first and second electrodes 57 and 59 defining a current path 60 which exhibits a variable resistance as a function of the voltage applied to a control electrode 62. The control voltage is derived from a direct current (D.-C.) source $E_1$, not shown, and which may be a battery for example, or a slowly varying voltage, such as an AGC voltage. A resistor 64 is connected between the control electrode 62 and the D.-C. voltage source $E_1$. The electrode 57 is connected to a point of fixed reference potential, shown as ground, and the electrode 59 is connected to the signal source 52 through a resistor 66 so that the current path 60 forms a voltage divider network with the resistor 66. Depending on the ratio of the resistance exhibited by the current path 60 to the resistor 66 a larger or smaller portion of the signal from the signal source 52 is coupled to the load.

Another voltage divider network, comprising the resistors 68 and 70, is connected across the current path 60. The resistors 68 and 70 have equal value so that the portion of the signal voltage across each resistor is one half of the signal voltage across the transistor 50. A capacitor 72 couples the signal voltage derived across the resistor 70 to the control electrode 62 so that the net voltage that controls the resistance exhibited by the current path 60 is a function of the signal level.

It should be noted that the series value of the resistors 68 and 70 should be large, compared to the value of the resistance exhibited by the current path 60, to prevent loading and to permit effective control of the amplitude of the signal coupled to the load in response to small variations of the resistance exhibited by the current path 60. Also the value of the resistor 64 should be large compared to the value of the resistors 68 and 70 and to the value of the reactance of the capacitor 72 so that the portion of the signal voltage fed back to the control electrode 62 is effectively determined by the ratio of the resistors 68 and 70. In addition, the capacitive reactance of the capacitor 72 at signal frequencies should be small compared to the resistance value of the resistor 64.

Alternatively, resistor 70 may be omitted in the circuit with the provision that resistors 64 and 68 have equal value of resistances in order to feed back one half of the signal voltage developed across the current path 60 to the control electrode 62.

Figure 5:
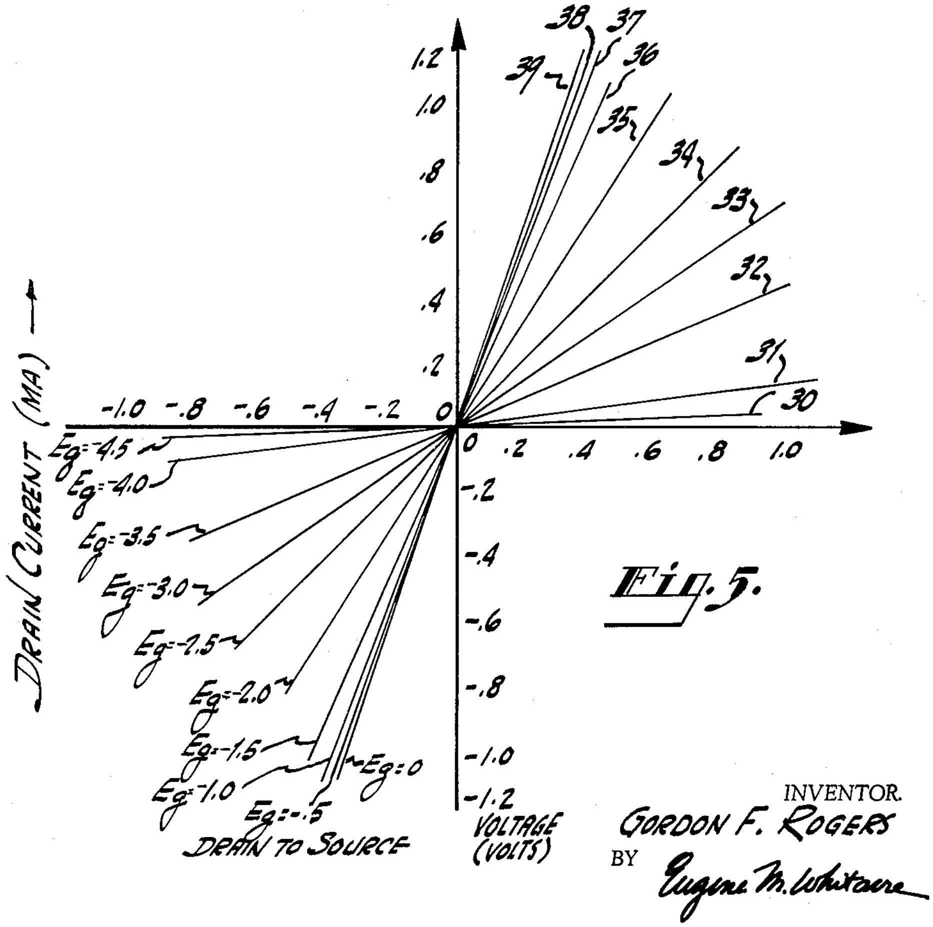
FIGURE 5 is a graph showing a family of drain current versus source-to-drain voltage curves for various values of gate to ground voltages (control voltages) of the transistor shown in the circuits of FIGURE 4.

Reference is now made to FIGURE 5 which is a graph showing a portion of the drain current versus drain-to-source voltage characteristic curves, of the circuit shown in FIGURE 4, for different values of control voltage.

The portion of the curves 30–39 are obtained by applying an alternating current signal voltage (sine wave) of a suitable amplitude across the source-drain current path 60. The current flowing through the current path 60 is measured by any suitable means. During the positive half cycle of the signal voltage the electrode 57 operates as the source electrode, and the electrode 59 operates as the drain electrode. During the negative half cycle of the signal voltage the electrode 59 operates as the source electrode and the electrode 57 operates as the drain electrode. By selecting different values of the control voltage $E_1$ the various curves 30–39 may be obtained. A feature of an insulated-gate field-effect transistor is that the zero bias characteristic can be at any of the curves 30–39. The location of the zero bias curve is selected during the manufacture of the transistor, i.e., by controlling the time and temperature of the step of the process when the silicon dioxide layer 28 shown in FIGURES 1 and 2 is grown, for example.

As shown in FIGURE 5 the drain current versus drain to source voltage characteristic curves of the P-type substrate transistor shown in FIGURES 1 and 2 are such that the drain current tends to decrease with negatively increasing bias voltages.

As compared to the P-type substrate transistor described in FIGURES 1 and 2, the drain current versus drain-source voltage characteristic of an N-type substrate insulated-gate field-effect transistor shows a current flow through the source-drain current path which is reduced as the gate-to-source voltage becomes more positive. It should also be mentioned that the zero gate voltage curve of the drain current versus drain-source voltage characteristic of an N-type substrate transistor may also be selected during manufacture to be in any one of the family of curves of its drain current versus drain-source voltage characteristic, as previously explained in connection with FIGURE 5.

As shown in FIGURE 5, the resistance exhibited by the current path 60 is symmetrical for both the positive and negative cycles of the signal voltage. In addition, the resistance exhibited by the current path 60, for the voltage range shown, in each of the curves 30–39 is substantially constant. The slope of the curves 30–39 is an inverse function of the resistance of the path 60.

In the absence of the feedback voltage to the control electrode 62, the curves 30–39 would be unsymmetrical in the first quadrant with respect to the corresponding curves in the third quadrant, and the voltage range in which the curves 30–39 would have a constant slope would be substantially reduced from the range illustrated in FIGURE 5.

The reason for the asymmetry of curves 30–39 when the feedback voltage is removed is that the operating gate bias voltage is different during the positive and negative half cycles. During the positive half cycle the effective gate bias voltage is solely dependent on the voltage supplied from bias potential source $E_1$, while in the negative half cycle the effective gate bias voltage is a function of the potential source $E_1$ plus the signal voltage.

The feedback network including the capacitor 72 provides symmetry by making the effective gate bias voltage independent of the amplitude of the signal voltage during both the positive and negative half cycles. By feeding back one half of the signal voltage to the gate or control electrode 62 the gate electrode is effectively balanced with respect to the source and drain electrodes and the net effective control voltage remains constant during the positive and negative half cycles.

Reference is now made to FIGURE 6 which shows another voltage controlled variable resistance network embodying the invention. There is shown a field-effect transistor 80, similar to the one shown in FIGURES 1 and 2, connected between the signal source 52 and a load represented by resistor 84 and which may be the input impedance of an amplifier circuit, for example. The source-drain current path 82 of transistor 80 is connected to ground at one end and the other end is connected through a resistor 66 to the signal source 52. The load resistor 84 is connected across the current path 82.

A voltage divider network, similar to the one shown in FIGURE 2, comprising resistors 86 and 88 which have equal values of resistance, is also coupled across the current path 82 to provide the necessary feedback signal voltage. One half of the signal voltage across resistors 86 and 88 is coupled through a capacitor 90 to the gate electrode 92. The substrate of semiconductor material 94 is directly connected to the gate electrode 92 to provide additional control of the current flow through the current path 82. Connecting the substrate 94 to the gate electrode 92 provides an increase of low frequency maximum transconductance of about 50 percent, which improves linearity and requires less control voltage.

A negative voltage is applied between ground and the gate electrode 92 through a resistor 96 by means of a source of bias potential or source of control voltage $E_2$, not shown. Transistor 80 is assumed to be a P-type substrate transistor which includes a pair of rectifying junctions (not shown) as described in reference to FIGURE 2. The negative voltage $E_2$, which may be a variable or slowly varying D.-C. voltage, reverse biases the rectifying junctions existing between the substrate and the electrodes defining the current path 82, whereby enhancement of the maximum low frequency transconductance of the transistor 80 may be obtained without causing distortion of the signal.

The drain current versus drain-to-source voltage characteristic of the transistor 80 may be the same as shown in FIGURE 5. A different type (N-type substrate), may be used in the circuit shown in FIGURE 6, as long as the appropriate polarity of the control voltage is employed.

Due to the control characteristics of the substrate of semiconductor material, the circuit shown in FIGURE 6 may be modified as shown in FIGURE 6A, so that the control voltage $E_2$ is solely applied to the substrate 94 to control the current flow through the current path 82. One half of the signal voltage is fed back to the gate electrode 92 to provide symmetry of the resistance exhibited by the current path 82. The resistor 96 and capacitor 90 may be omitted.

Alternatively, as shown in FIGURE 6B, the control voltage $E_2$ may be solely applied to the gate electrode 92, and the portion of signal voltage developed across the resistor 88 may be solely applied to the substrate 94 of semiconductor material.

Figure 7:
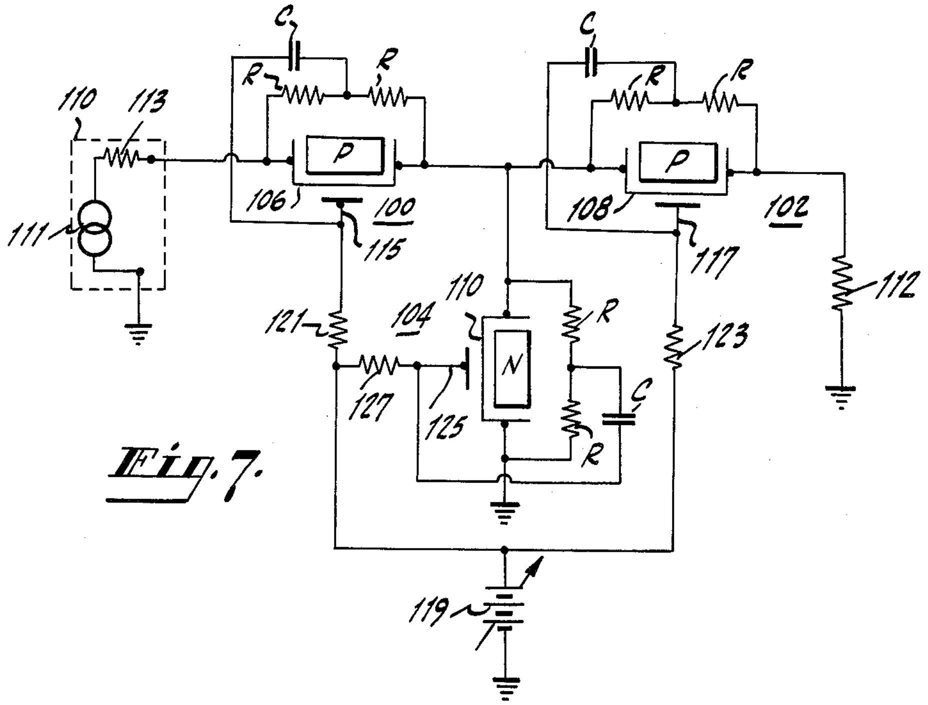
FIGURE 7 is a schematic circuit diagram of an attenuator circuit embodying the invention.

Reference is now made to FIGURE 7 which is a schematic circuit diagram of a variable attenuator circuit embodying the invention. There is shown field-effect transistors 100 and 102, which are similar to the transistor shown in FIGURES 1 and 2, and field-effect transistor 104 which is of opposite type conductivity.

Although transistors 100 and 102 are illustrated to be P-type substrate field-effect transistors, and transistor 104 is illustrated as an N-type substrate transistor, transistors 100 and 102 may be of either type conductivity as long as both are of the same type conductivity and transistor 104 is of opposite type conductivity.

The current paths 106, 108 and 110 are connected in a T configuration between the signal source 110 and a load resistor 112, which represents the input impedance of a utilization circuit, an amplifier circuit, for example. The signal source 110 comprises the signal source generator 111 and the internal generator impedance represented by the resistor 133. The current paths 106 and 108 of transistors 100 and 102 are respectively, the series arms of the T type attenuator circuit, and the current path 110 of transistor 104 is the shunt arm of the circuit. Voltage divider networks are connected across current paths 106, 108 and 110, each comprising two resistors having a resistance value R. Each of the voltage divider networks are center tapped and the center tap voltage is coupled to the corresponding gate or control electrode by a coupling capacitor C.

The gate electrodes 115, 117 and 125 of transistors 100, 102 and 104 are connected to a variable source of bias potential (control voltage) through resistors 121, 123 and 127 respectively. The source of bias potential is represented by a battery 119, but it should be understood that it may be a pulse source that may automatically control the impedance exhibited by the current paths 106, 108 and 110 in accordance with a predetermined program by providing pulses of desired amplitude polarity and duration. The frequency components of the pulse should be lower than that of the signal because of the possibility of coupling the pulse into the signal through the capacitor.

As previously explained, P-type substrate field-effect transistors (100 and 102) tend to decrease the current flow through the source-drain current path for negative-going gate voltages, while N-type substrate field-effect transistors (transistor 104 for example) tend to increase the current flow through the source-drain current path for negative-going gate voltages.

If it is desired to employ three field-effect transistors of the same type conductivity in the circuit shown in FIGURE 7, two separate control voltage sources should be used, one for controlling the series transistors 100 and 102 and the other for controlling the shunt transistor 104. The plurality of control voltage sources is employed so that when a control voltage that tends to increase the resistance exhibited by the series transistors 100 and 102 is applied thereto, a control voltage is simultaneously applied to the transistor 104 that tends to decrease the resistance exhibited by the current path 110. As long as the transistors have the same type conductivity the control voltages applied should have opposite type polarity to produce the desired operation.

In operation, the portion of the signal that will be received at the load resistor 112 depends on the magnitude of the resistances exhibited by the current paths 106, 108 and 110. Due to the type conductivity of the transistors 100, 102 and 104 a voltage setting of the battery 119 that tends to cause the current paths 106 and 108 to exhibit a large resistance with respect to the resistance 112 also tends to cause the current path 110 to exhibit a resistance that is small compared to the resistor 112. Under this condition the amplitude of the signal voltage across the resistor 112 is small, and for some voltage settings of the battery 119 substantially no signal voltage appears across resistor 112.

When, however, current paths 106 and 108 exhibit a small resistance and current path 110 exhibits a large resistance in comparison to the resistance of resistor 112, substantially all the signal voltage from signal source 110 appears across the resistor 112.

Each of the feedback networks comprising the resistors R and the coupling capacitor C provide the desired symmetry, as explained in reference to FIGURE 5, by providing a control voltage that is not a function of the input signal in either the negative or the positive half cycles of signal voltage, so that the effective signal voltage in successive half cycles is equal and of opposite polarity.

The circuit shown in FIGURE 7 may be modified so that each of the arms of the attenuator circuit has the substrate of semiconductor material of the corresponding transistor connected to the gate electrode, as shown in FIGURE 6. This modified arrangement provides the advantages of a larger maximum transconductance and, hence, a larger change in the resistance exhibited by the current path of each transistor for the same amount of control voltage change as well as more effective feedback to provide a more linear resistance characteristic.

The attenuator circuit shown in FIGURE 7 may be modified to include only transistors 100 and 104 to provide an L type attenuator circuit, or if desired, a single series transistor and a fixed resistor may comprise the attenuator circuit.

Although the circuits described include symmetrical type transistors (the gate electrode is equidistant from the source and drain electrodes, as described in connection with FIGURES 1, 2 and 3) non-symmetrical transistors (for example, with the gate electrode displaced closer to the source electrode) may be used. The portion of the signal voltage fed back to the control electrode to provide improved linearity of the resistance exhibited by the current path, is not one half of the signal voltage developed across the current path, but a portion of the signal voltage determined in accordance with the asymmetry. The desired portion of the signal voltage to be fed back is developed by a voltage divider circuit comprising two resistors having different values of resistance.

A practical method to determine the values of resistance is to replace the voltage divider network by a potentiometer connected across the current path. The potentiometer's center arm is coupled to the gate electrode and adjusted for linear resistance operation.

What is claimed is:

1. In combination, a semiconductor device having first and second electrodes defining a current path and a control electrode for controlling the resistance exhibited by said current path as a function of a voltage applied to said control electrode, a pair of signal input terminals, a pair of signal ontput terminals, means including said semiconductor device coupling said signal input and output terminals to control the efficiency of translation between said terminals as a function of the resistance exhibited by said current path, said means including a feedback circuit including a capacitor for applying a portion of the signal voltage developed across said current path to said control electrode, and means coupled between said control electrode and in common to one of said input and output terminals for applying a control voltage to control the resistance exhibited by said current path.

2. A variable resistance device circuit comprising, a semiconductor device having first and second electrodes defining a current path and a gate electrode for controlling the current flow through said current path, means connecting said first electrode to a point of reference potential, a source of alternating-current signal voltage, a load impedance element, means connecting said signal source and said load impedance element in parallel between said first and second electrodes, means connected between said gate electrode and said point of reference potential for applying a control voltage to determine the resistance exhibited by said current path, a voltage divider network comprising first and second resistors connected between said first and second electrodes, and capacitive coupling means for applying the voltage developed across one of said first and second resistors to said gate electrode so that the effective control voltage to determine the resistance exhibited by said current path is equal for corresponding amplitudes of signal voltage of opposite polarity, whereby the resistance exhibited by said current path for corresponding amplitudes of signal voltage of opposite polarity is symmetrical.

3. A variable resistance device circoit comprising, a field-effect transistor having source and drain electrodes defining a current path and a gate electrode for controlling the current flow through said current path, said gate, source and drain electrodes being formed on a substrate of semi-conductor material, said gate electrode being insulated from said substrate, a pair of signal input terminals, a pair of signal output terminals, means including said field-effect transistor connecting said input and output terminals, said means including first and second resistors connected in series across said current path and a capacitor connected between said gate electrode and said resistors for applying the signal voltage across one of said first and second resistors to said gate electrode, and means connected between said gate electrode and a point of reference potential for applying a control voltage that determines the resistance exhibited by said current path.

4. In combination, a semiconductor device having first and second electrodes defining a current path and a control electrode for controlling the resistance exhibited by said current path as a function of a voltage applied to said control electrode, said current path being connected at one end thereof to a point of fixed reference potential, means for applying a signal voltage across said current path, means including the input impedance of a utilization circuit connected across said current path, a control voltage source connected between said control electrode and said point of fixed reference potential, and feedback means including a capacitor coupled between the other end of said current path and said control electrode for coupling a predetermined portion of said signal voltage to said control electrode whereby the resistance exhibited by said current path is symmetrical for the negative and positive half cycles of said signal voltage.

5. In combination, a field-effect semiconductor device having first and second electrodes defining a current path and a gate electrode for controlling the current flow through said current path, said current path being connected at one end thereof to a point of reference potential, a source of alternating current signal voltage, an impedance load, means coupling said signal source and said resistive load in parallel across said current path, means including a resistor connected between said gate electrode and said point of reference potential for applying a control voltage to determine the resistance exhibited by said current path, a voltage divider network, including a center tap, connected between said first and second electrodes, and means including a capacitor for coupling the voltage developed at said center tap to said gate electrode so that the effective control voltage is independent of the amplitude and polarity of said signal voltage.

6. In combination, an insulated-gate field-effect transistor having source and drain electrodes on a substrate of semiconductor material and a gate electrode insulated from said substrate, said gate electrode controlling the current flow through the current path defined by said source and drain electrodes as a function of the voltage applied thereto, means connecting one end of said current path to a point of reference potential, means coupling the other end of said current path to a resistive load, means including a resistor for applying a signal voltage across said current path, means connected between said gate electrode and said point of reference potential for applying a control voltage to said field-effect transistor, means connected across said current path including two equal resistors for deriving a portion of said signal voltage that is equal to one half of the amplitude of the signal voltage applied across said current path, means coupling said derived portion of said signal voltage to said gate electrode so that the resistance exhibited by said current path to signal voltages of opposite polarity is symmetrical, and circuit means coupling said substrate of semiconductor material to said gate electrode to increase the maximum incremental change in output for a given incremental change in control voltage.

7. A signal attenuator circuit comprising, first, second and third insulated-gate field-effect transistors each having first and second electrodes on a substrate of semiconductor material and a gate electrode insulated from said substrate, said first and second electrodes defining a current path that exhibits a resistance as a function of the control voltage applied to said gate electrode, said first and second transistors being of a type of conductivity that is opposite from the type conductivity of said third transistor so that a control voltage that causes the current paths of said first and second transistors to exhibit a small resistance also causes the current path of said third transistor to exhibit a large resistance, and vice versa, circuit means connecting the current paths of said first, second and third transistors in a T-type attenuator circuit so that the current paths of said first and second transistors correspond to the series arms of said attenuator circuit, and so that the current path of said third transistor corresponds to the shunt arm of said attenuator circuit, a source of alternating signal voltage for applying an input signal, a resistive load, means connecting said attenuator circuit between said signal source and said load to determine the efficiency of translation of said input signal, center-tapped voltage-divider network circuit means connected across each of said current path to develop one half of the signal voltage that appears across across of said current paths, a capacitor connected between each of the center taps of said voltage divider networks and the corresponding one of the gate electrodes for coupling said one half of said signal voltage to each of said gate electrodes, and control voltage means coupled between a point of fixed reference potential and each of said gate electrodes for applying a voltage that determines the resistance exhibited by each of said current paths.

8. In combination, first and second semiconductor devices each having first and second electrodes defining a current path and a control electrode for determining the flow of current through said current path as a function of the control voltage applied to said control electrode, a pair of signal input terminals, a pair of signal output terminals, one of the terminals of each of said pairs of input and output terminals being common to both pairs of terminals and being connected to a point of fixed reference potential, an alternating current signal voltage source, a load, means for connecting said current paths of said first and second transistors in series between said input and common terminals and said current path of said second transistor between said common and output terminals, means for coupling said load between said output and common terminals, voltage divider circuit means for developing a portion of the signal voltage appearing across each of said current paths, a capacitor connected between each of said voltage divider means and the corresponding control electrode to feed back said portion of signal voltage to each of said control electrodes, and circuit means coupled between said point of fixed potential and each of said control electrodes to apply a control voltage that determines the resistance exhibited by said current path so that when said current path of said first transistor exhibits a large resistance said current path of said second transistor exhibits a small resistance whereby the amplitude of the signal voltage across said load is small, and vice versa.

9. In combination, a semiconductor device having first and second electrodes defining a current path and a control electrode for controlling the resistance exhibited by said current path as a function of a voltage applied to said control electrode, a pair of signal input terminals, a pair of signal output terminals, one of said terminals of each of said pairs of input and output terminals being connected to each other, means including a resistor connected in series with said current path coupling said signal input and output terminals to control the efficiency of translation between said terminals as a function of the ratio of the resistance of said resistor and the resistance exhibited by said current path, said means including a feedback circuit comprising a capacitor for applying a portion of the signal voltage developed across said current path to said control electrode, and means coupled between said control electrode and said one input terminal for applying a control voltage to control the resistance exhibited by said current path.

10. A variable resistance device circuit comprising, a semiconductor device having first and second electrodes defining a curent path and a gate electrode for controlling the current flow through said current path, means connecting said first electrode to a point of reference potential, a source of alternating current signal voltage, a load impedance element, means including a first resistor connecting said signal source and said load impedance element in parallel between said first and second electrodes, means including a second resistor connected between said gate electrode and said point of reference potential for applying a control voltage to determine the resistance exhibited by said current path, a voltage divider network comprising third and fourth resistors connected between said first and second electrodes, said first, second, third and fourth resistors having a resistance value that is large compared to the value of the impedance of said impedance load, capacitive coupling means for applying the voltage developed across one of said third and fourth resistors to said gate electrode so that the effective control voltage to determine the resistance exhibited by said current path is equal for corresponding amplitudes of signal voltage of opposite polarity, whereby the resistance exhibited by said current path for corresponding amplitudes of signal voltage of opposite polarity is symmetrical.

11. In combination:

an insulated-gate field-effect transistor having a first and second regions formed on a substrate of semiconductor material with individual electrodes connected to each of said first and second regions and said substrate, the portion of said substrate separating said first and second regions providing a channel of controllable conductivity between said regions, and a gate electrode insulated from said substrate and overlying at least a portion of, said channel for controlling the conductivity thereof;

a pair of input terminals;

a pair of output terminals;

one of the terminals of each of said pairs of input and output terminals being common to both pairs of terminals and being connected to a fixed reference potential;

means, including a series resistor, for connecting said first and second region electrodes between the other one of said input terminals and said point of reference potential;

means for connecting the other one of said output terminals to the junction of said resistor and said one of first and second region electrodes, feedback means including a pair of resistors connected across said first and second region electrodes and a capacitor connected between said gate electrode and the junction of said resistors for applying a portion of the signal voltage developed across said first and second region electrodes to said gate electrode;

means connected between said gate electrode and said point of reference potential for applying control voltage thereto, and means connected between said substrate electrode and one of said first and second regions for altering the resistance exhibited by said channel controllable conductivity.

12. In combination, an insulated-gate field-effect transistor having source and drain electrodes on a substrate of semiconductor material and a gate electrode insulated from said substrate, said gate electrode controlling the current flow through the current path defined by said source and drain electrodes as a function of the voltage applied thereto, means connecting one end of said current path to a point of reference potential, means coupling the other end of said current path to a resistive load, means including a first resistor and a source of signal voltage connected in series across said current path, means including a second resistor connected between said gate electrode and said point of reference potential for applying a control voltage, means connected across said current path including third and fourth resistors for deriving a portion of said signal voltage, said first, second, third and fourth resistors having a value of resistance that is large compared to the value of the resistance of said resistive load, means coupling said portion of said signal voltage to said gate electrode, and circuit means coupling said substrate of semiconductor material to said gate electrode to provide a linear resistance characteristic of said current path.

13. The combination comprising, a field-effect transistor having first and second electrodes formed on a substrate of semiconductor material and a gate electrode insulated from said substrate, said substrate of semiconductor material being provided with an electrode, said first and second electrodes defining a current path, said gate and substrate electrodes controlling the resistance exhibited by said current path as a function of the voltage applied to at least one of said gate and substrate electrodes, a pair of signal input terminals, a pair of signal output terminals, one of said pair of input terminals and one of said pair of output terminals being connected to each other as a common terminal, a series circuit including a resistor and said current path connected between said input terminals, means connecting the other of said output terminals between said current path and said resistor, means including a source of control voltage connected between one of said gate and substrate electrodes and said common terminal for controlling the current flow through said current path, and means coupled to the other of said gate and substrate electrodes for feeding back a portion of the signal developed across said current path.

14. The combination comprising, a field-effect transistor having first and second electrodes formed on a substrate of semiconductor material and a gate electrode insulated from said substrate, said substrate of semiconductor material being said first and second electrodes defining a current path, the resistance exhibited by said current path being controlled as a function of the voltage applied to at least one of said control and substrate electrodes, an input, an output and a common terminal, means for applying an input signal between said input and common terminals, a load impedance connected between said output and common terminals, a resistor connected to said first electrode to form with said current path a series circuit between said input and common terminals, means connecting said output terminal to the junction point of said resistor and said first electrode, means including a source of control voltage connected between one of said gate and substrate electrodes and said common terminal for controlling the resistance exhibited by said current path, means coupled across said current path for deriving a portion of said input signal, and means for applying said portion of input signal to one of said gate and substrate electrodes to provide linearity to the resistance exhibited by said current path.

15. In combination, a semiconductor device having first and second electrodes defining a current path and a control electrode for controlling the resistance exhibited by said current path as a function of a voltage applied to said control electrodes, means for connecting one end of said current path to a point of reference potential, a source of alternating current signal voltage, a series circuit including a first resistor and said source of alternating current signal voltage connected across said current path, second and third resistors connected in series across said current path for deriving a portion of the signal voltage developed across said current path, a capacitor connected between said control electrode and said second and third resistors for coupling said portion of signal voltage to said control electrode to provide linearity to the resistance exhibited by said current path, control voltage circuit means including a fourth resistor connected between said control electrode and said point of reference potential for applying a control voltage that determines the resistance exhibited by said current path, a resistive load connected across said current path, and said second, third and fourth resistors having a value that is large compared to both the resistance exhibited by said current path and said resistive load, said fourth resistor having a value of resistance that is large compared to the reactance exhibited by said capacitor at signal frequencies.

16. A signal translating circuit comprising, a semiconductor device including a bidirectional current path and control circuit means for controlling the current flow through said current path, said current path exhibiting a resistance as a function of the control voltage applied to said control circuit means, first and second terminals, said first terminal being connected to a point of fixed reference potential, means for connecting said current path between said first and second terminals, means for applying a signal voltage between said first and second terminals, feedback means coupling a portion of said signal voltage to said control circuit meas to provide symmetry to the resistance exhibited by said current path to signal voltages of opposite polarity, and control voltage means coupled by a path exclusive of said feedback means between said control circuit means and said first terminal for applying a control voltage that determines the resistance exhibited by said current path.

17. The combination comprising, a semiconductor device including a bidirectional current path and control circuit means for controlling the current flow through said current path, means for connecting one end of said current path to a point of reference potential, means including a signal source coupled to said current path and to said point of reference potential for applying a signal voltage to said device to produce current flow through said current path, feedback means coupling a portion of said signal voltage to said control circuit means, and circuit means for applying a control voltage by a path exclusive of said feedback means between said control circuit means and said point of reference potential.

18. A signal translating circuit comprising, a semiconductor device having bidirectional current flow through an electrode-defined current path and current control crcuit means for controlling the flow of current through said current path, means for connecting one end of said current path to a point of fixed reference potential, means coupled across said current path for applying a bipolar signal voltage to be translated, feedback means coupling a portion of said signal voltage between said control circuit means and said point of reference potential for linearizing the current flow through said current path in response to said signal voltage, and means including a control voltage source connected between said control circuit means and said point of reference potential for applying a control voltage to said semiconductor device to determine the incremental change of current flow through said current path for a given incremental change in signal voltage, said control voltage means being connected in a circuit path that is exclusive ofsaid feedback means.

19. A variable resistance circuit comprising, a semiconductor device having bidirectional current flow through an electrode-defined current path and current control circuit means for controlling the flow of current through said current path, means for connecting one of the electrodes defining said current path to a point of fixed reference potential, means coupled to the electrodes defining said current path for applying a bipolar signal voltage, feedback means including a voltage divider network for coupling a portion of said signal voltage between said control circuit means and said point of reference potential, and means connected between said control circuit means and said point of reference potential by a path exclusive of feedback means for applying a control voltage to said semiconductor device to determine the incremental change of current flow through said current path for a given incremental change in signal voltage.

20. The combination comprising, a field-effect transistor including a bidirectional current path and control circuit means for controlling the current flow through said current path, said current path exhibiting a resistance as a function of the control voltage applied to said control circuit means, first and second terminals, said first terminal being connected to a point of fixed reference potential, means for connecting said current path between said first and second terminals, means for applying a signal voltage between said first and second terminals, feedback means coupling a portion of said signal voltage to said control circuit means to provide symmetry to the resistance exhibited by said current path to signal voltages of opposite polarity, and control voltage coupled between said control circuit means and said first terminal by a path exclusive of said feedback means.

References Cited by the Examiner

UNITED STATES PATENTS

| | | | |
|---|---|---|---|
| 3,102,230 | 8/63 | Kahng | 307—88.5 X |
| 3,131,312 | 4/64 | Putzrath | 307—88.5 |

JOHN W. HUCKERT, *Primary Examiner.*